(12) United States Patent
Loh

(10) Patent No.: US 7,976,186 B2
(45) Date of Patent: Jul. 12, 2011

(54) POWER SURFACE MOUNT LIGHT EMITTING DIE PACKAGE

(75) Inventor: Ban P. Loh, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/856,320

(22) Filed: Aug. 13, 2010

(65) Prior Publication Data
US 2010/0301372 A1 Dec. 2, 2010

Related U.S. Application Data

(62) Division of application No. 11/703,721, filed on Feb. 8, 2007, now Pat. No. 7,775,685, which is a division of application No. 10/446,532, filed on May 27, 2003, now Pat. No. 7,264,378.

(51) Int. Cl.
*F21V 5/00* (2006.01)

(52) U.S. Cl. ........ 362/245; 362/294; 362/246; 362/800; 257/98

(58) Field of Classification Search ................... 362/294, 362/245, 246; 257/98–100
See application file for complete search history.

(56) References Cited

U.S. PATENT DOCUMENTS

| | | |
|---|---|---|
| 3,443,140 A | 5/1969 | Jensen |
| 3,760,237 A | 9/1973 | Jaffe |
| 3,875,456 A | 4/1975 | Kano et al. |
| 4,152,618 A | 5/1979 | Abe et al. |
| 4,168,102 A | 9/1979 | Chida et al. |
| 4,267,559 A | 5/1981 | Johnson et al. |
| 4,603,496 A | 8/1986 | Latz et al. |
| 5,119,174 A | 6/1992 | Chen |
| 5,173,839 A | 12/1992 | Metz, Jr. |
| 5,633,963 A | 5/1997 | Rickenbach et al. |
| 5,649,757 A | 7/1997 | Aleman |
| 5,785,418 A | 7/1998 | Hochstein |
| 5,789,772 A | 8/1998 | Jiang |
| 5,835,661 A | 11/1998 | Tai |
| 5,841,177 A | 11/1998 | Komoto et al. |

(Continued)

FOREIGN PATENT DOCUMENTS

CN 03820849 8/2008

(Continued)

OTHER PUBLICATIONS

International Search Report corresponding to PCT International Application No. PCT/US03/27421 dated Nov. 10, 2004.

(Continued)

*Primary Examiner* — Ali Alavi
(74) *Attorney, Agent, or Firm* — Jenkins, Wilson, Taylor & Hunt, P.A.

(57) ABSTRACT

A light emitting die package includes a substrate, a reflector plate, and a lens. The substrate has traces for connecting an external electrical power source to a light emitting diode (LED) at a mounting pad. The reflector plate is coupled to the substrate and substantially surrounds the mounting pad, and includes a reflective surface to direct light from the LED in a desired direction. The lens is free to move relative to the reflector plate and is capable of being raised or lowered by the encapsulant that wets and adheres to it and is placed at an optimal distance from the LED chip(s). Heat generated by the LED during operation is drawn away from the LED by both the substrate (acting as a bottom heat sink) and the reflector plate (acting as a top heat sink).

4 Claims, 6 Drawing Sheets

U.S. PATENT DOCUMENTS

| | | |
|---|---|---|
| 5,847,507 A | 12/1998 | Butterworth |
| 5,849,396 A | 12/1998 | Ali et al. |
| 5,851,847 A | 12/1998 | Yamanaka |
| 5,857,767 A | 1/1999 | Hochstein |
| 5,869,883 A | 2/1999 | Mehringer et al. |
| 5,907,151 A | 5/1999 | Gramann et al. |
| 5,959,316 A | 9/1999 | Lowery |
| 5,982,090 A | 11/1999 | Kalmanash |
| 5,998,925 A | 12/1999 | Shimizu et al. |
| 6,060,729 A | 5/2000 | Suzuki et al. |
| 6,124,635 A | 9/2000 | Kuwabara |
| 6,155,699 A | 12/2000 | Miller et al. |
| 6,159,033 A | 12/2000 | Oka |
| 6,180,962 B1 | 1/2001 | Ishinaga |
| 6,238,599 B1 | 5/2001 | Gelorme et al. |
| 6,274,924 B1 | 8/2001 | Carey et al. |
| 6,281,435 B1 | 8/2001 | Maekawa |
| 6,307,272 B1 | 10/2001 | Takahashi et al. |
| 6,318,886 B1 | 11/2001 | Stopa et al. |
| 6,329,706 B1 | 12/2001 | Nam |
| 6,331,063 B1 | 12/2001 | Kamada et al. |
| 6,335,548 B1 | 1/2002 | Roberts et al. |
| 6,362,964 B1 | 3/2002 | Dubhashi et al. |
| RE37,707 E | 5/2002 | Bozzini et al. |
| 6,429,513 B1 | 8/2002 | Shermer, IV et al. |
| 6,444,498 B1 | 9/2002 | Huang et al. |
| 6,456,766 B1 | 9/2002 | Shaw et al. |
| 6,457,645 B1 | 10/2002 | Gardner, Jr. |
| 6,468,821 B2 | 10/2002 | Maeda et al. |
| 6,469,322 B1 | 10/2002 | Srivasta et al. |
| D465,207 S | 11/2002 | Williams et al. |
| 6,480,389 B1 | 11/2002 | Shie et al. |
| 6,492,725 B1 | 12/2002 | Loh et al. |
| 6,501,103 B1 | 12/2002 | Jory et al. |
| 6,525,386 B1 | 2/2003 | Mills |
| 6,531,328 B1 | 3/2003 | Chen |
| 6,541,800 B2 | 4/2003 | Barnett et al. |
| 6,559,525 B2 | 5/2003 | Huang |
| 6,582,103 B1 | 6/2003 | Popovich et al. |
| 6,610,563 B1 | 8/2003 | Waitl et al. |
| 6,614,103 B1 | 9/2003 | Durocher et al. |
| 6,670,648 B2 | 12/2003 | Isokawa et al. |
| 6,672,734 B2 | 1/2004 | Lammers |
| 6,680,491 B2 | 1/2004 | Nakanishi et al. |
| 6,680,568 B2 | 1/2004 | Fujiwara et al. |
| 6,707,069 B2 * | 3/2004 | Song et al. .................. 257/79 |
| 6,710,544 B2 | 3/2004 | Schliep |
| 6,759,803 B2 | 7/2004 | Sorg |
| 6,768,525 B2 | 7/2004 | Paolini et al. |
| 6,789,921 B1 | 9/2004 | Deloy et al. |
| 6,791,259 B1 | 9/2004 | Stokes et al. |
| 6,809,347 B2 | 10/2004 | Tasch et al. |
| 6,844,903 B2 | 1/2005 | Mueller-Mach et al. |
| 6,849,867 B2 | 2/2005 | Roberts et al. |
| 6,850,001 B2 | 2/2005 | Takekuma |
| 6,864,567 B2 | 3/2005 | Yu |
| 6,874,910 B2 | 4/2005 | Sugimoto et al. |
| 6,897,486 B2 | 5/2005 | Loh |
| 6,903,380 B2 | 6/2005 | Barnett et al. |
| 6,943,380 B2 | 9/2005 | Ota et al. |
| 6,943,433 B2 | 9/2005 | Kamada |
| 6,949,772 B2 | 9/2005 | Shimizu |
| 6,960,878 B2 | 11/2005 | Sakano et al. |
| 7,044,620 B2 | 5/2006 | Van Duyn |
| 7,078,254 B2 | 7/2006 | Loh |
| 7,078,728 B2 | 7/2006 | Ishii et al. |
| 7,084,435 B2 | 8/2006 | Sugimoto et al. |
| 7,118,262 B2 | 10/2006 | Negley |
| 7,122,884 B2 | 10/2006 | Cabahug et al. |
| 7,192,163 B2 | 3/2007 | Park |
| 7,196,163 B2 | 3/2007 | Hazuda et al. |
| 7,204,631 B2 | 4/2007 | Weber et al. |
| 7,244,965 B2 | 7/2007 | Andrews et al. |
| 7,264,378 B2 | 9/2007 | Loh |
| 7,279,719 B2 | 10/2007 | Suehiro et al. |
| 7,280,288 B2 | 10/2007 | Loh |
| 7,322,732 B2 | 1/2008 | Negley |
| 7,329,399 B2 | 2/2008 | Camaro et al. |
| 7,456,499 B2 | 11/2008 | Loh et al. |
| 7,659,551 B2 * | 2/2010 | Loh ............................. 257/98 |
| 7,692,206 B2 | 4/2010 | Loh |
| 7,775,685 B2 * | 8/2010 | Loh ........................ 362/311.02 |
| 2002/0084462 A1 | 7/2002 | Tamai et al. |
| 2003/0057573 A1 | 3/2003 | Sekine et al. |
| 2003/0193083 A1 | 10/2003 | Isoda |
| 2003/0201451 A1 | 10/2003 | Suehiro |
| 2004/0004435 A1 | 1/2004 | Hsu |
| 2005/0001433 A1 | 1/2005 | Seelin |
| 2005/0093430 A1 | 5/2005 | Ibbetson et al. |
| 2005/0152146 A1 | 7/2005 | Owen et al. |
| 2005/0265029 A1 | 12/2005 | Epstein et al. |
| 2006/0083017 A1 | 4/2006 | Wang |
| 2006/0097385 A1 | 5/2006 | Negley |
| 2006/0098441 A1 | 5/2006 | Chou |
| 2006/0215075 A1 | 9/2006 | Huang et al. |
| 2006/0263545 A1 | 11/2006 | Coenjarts |
| 2007/0054149 A1 | 3/2007 | Cheng |
| 2007/0085194 A1 | 4/2007 | Mao et al. |
| 2008/0231170 A1 | 9/2008 | Masato et al. |

FOREIGN PATENT DOCUMENTS

| | | |
|---|---|---|
| DE | 19945919 | 3/2000 |
| EP | 0965493 | 12/1999 |
| EP | 1059678 | 12/2000 |
| EP | 1087447 A1 | 3/2001 |
| EP | 1179858 | 2/2002 |
| EP | 1416219 | 5/2004 |
| EP | 1418628 | 5/2004 |
| EP | 1537603 | 7/2008 |
| EP | 1953825 | 8/2008 |
| EP | 1680816 | 9/2009 |
| JP | H09-083018 | 3/1997 |
| JP | 09274454 | 10/1997 |
| JP | H10-098215 | 4/1998 |
| JP | H10-321909 | 12/1998 |
| JP | 2001-177136 | 7/1999 |
| JP | 2000-013962 | 1/2000 |
| JP | 2000-236116 | 8/2000 |
| JP | 2001-036148 | 2/2001 |
| JP | 2001-144333 | 5/2001 |
| JP | 2002-319711 | 10/2002 |
| JP | TW 517402 | 1/2003 |
| JP | 2003-110146 | 4/2003 |
| JP | 2003-124525 | 4/2003 |
| JP | TW 533604 | 5/2003 |
| JP | 2003-197974 | 7/2003 |
| JP | 2002-103977 | 10/2003 |
| JP | 2003-298117 | 10/2003 |
| JP | 2003-318448 | 11/2003 |
| JP | 2003-124528 | 5/2004 |
| TW | 518775 | 1/2003 |
| WO | WO 9931737 | 6/1999 |
| WO | WO 2004/023552 | 3/2004 |
| WO | WO 2005/043627 | 5/2005 |

OTHER PUBLICATIONS

International Search Report corresponding to PCT International Application No. PCT/US04/34768 dated Apr. 21, 2005.

Supplemental European Search Report corresponding to EP Appl. No. 03794564.9 dated Aug. 22, 2006.

Official Action corresponding to U.S. Appl. No. 11/153,724 dated Nov. 2, 2006.

Notification of International Preliminary Report on Patentability and Written Opinion corresponding to PCT International Application No. PCT/US06/025193 dated Jan. 23, 2007. (mail date).

International Search Report dated Feb. 27, 2007.

Supplemental European Search Report corresponding to European Patent Application No. 04795871 dated Mar. 7, 2007.

Official Action corresponding to U.S. Appl. No. 11/153,724 dated May 3, 2007.

Chinese Office Action for Appl. No. 03820849 with English translation dated Jul. 6, 2007.

Official Action corresponding to U.S. Appl. No. 11/153,724 dated Oct. 16, 2007.

Official Action corresponding to U.S. Appl. No. 11/694,046 dated Oct. 25, 2007.
International Search Report and Written Opinion for PCT/US06/025193 dated Oct. 29, 2007.
European Examination Report corresponding to European Patent Application No. 04795871.5 dated Nov. 12, 2007.
Official Action/Restriction Requirement corresponding to U.S. Appl. No. 11/168,018 dated Dec. 11, 2007.
Notification of International Preliminary Report on Patentability and Written Opinion for PCT International Application No. PCT/US06/023195 dated Jan. 3, 2008.
Notification of International Preliminary Report on Patentability and Written Opinion corresponding to PCT International Application No. PCT/US06/025193 dated Jan. 17, 2008.
Official Action corresponding to U.S. Appl. No. 11/168,018 dated Mar. 27, 2008.
Official Action corresponding to U.S. Appl. No. 11/694,046 dated May 7, 2008.
Official Action corresponding to U.S. Appl. No. 11/168,018 dated May 28, 2008.
EPO Notice of Patent Grant for EP 03794564.9 dated Jun. 12, 2008.
Final Office Action for U.S. Appl. No. 11/153,724 dated Jul. 1, 2008.
European Notice of Publication for EP 08157294 dated Jul. 9, 2008.
Chinese Office Action for CN 2004-80030943.3 (with English Translation) dated Jul. 4, 2008 but received Aug. 7, 2008 (incorrectly dated on some docs as Aug. 4, 2008).
European Search Report and Written Opinion for EP 08157294.3 dated Aug. 20, 2008.
Office Action for U.S. Appl. No. 11/153,724 dated Oct. 17, 2008.
Office Action with Restriction/Election Requirement dated Oct. 20, 2008 for U.S. Appl. No. 11/689,868.
Non-final Office Action for U.S. Appl. No. 11/694,046 dated Dec. 1, 2008.
Final Office Action corresponding to U.S. Appl. No. 11/168,018 dated Dec. 10, 2008.
Chinese Office Action for CN 2004-80030943.3 with English translation dated Dec. 12, 2008.
Non-final Office Action for U.S. Appl. No. 11/689,868 dated Jan. 26, 2009.
Office Action with Restriction/Election Requirement for U.S. Appl. No. 11/703,721 dated Feb. 26, 2009.
European Office Action for EP Appl. No. 08157294.3 dated Mar. 16, 2009.
Final Office Action for U.S. Appl. No. 11/153,724 dated Mar. 23, 2009.
Communication Under Rule 71(3) EPC (with enclosures) regarding intent to grant European patent for Application No. 04795871.5-222 dated Apr. 24, 2009.
Office Action (with English Summary) dated Apr. 28, 2009 regarding Japanese Patent Application No. 2004-534428.
Communication dated May 13, 2009 regarding no Opposition for European Application No. 03794564.9-2222 / Patent No. 1537603.
Official Action corresponding to Japanese Patent Application No. 2006-536764 (with English Translation) dated Jun. 9, 2009.
Official Action corresponding to U.S. Appl. No. 11/168,018 dated Jul. 7, 2009.
Official Action corresponding to U.S. Appl. No. 11/689,868 dated Jul. 17, 2009.
Notice of Allowance dated Jul. 24, 2009 regarding U.S. Appl. No. 11/694,046.
Official Action corresponding to U.S. Appl. No. 11/703,721 dated Aug. 6, 2009.
Decision to Grant from European Patent Office corresponding to European Patent Application No. 1,680,816 dated Sep. 3, 2009.
Official Action and Search Report corresponding to Taiwan Patent Application No. 092123988 dated Sep. 11, 2009 (with English Translation).
Official Action corresponding to Chinese Patent Application No. 2004800309433 (with English Translation) dated Sep. 25, 2009.
Official Action corresponding to U.S. Appl. No. 11/153,724 dated Nov. 9, 2009.
European Search Report corresponding to European Patent Application No. 09171045.9 dated Nov. 23, 2009.
Japanese Office Action (English Translation) corresponding to Japanese Patent Application No. 2006-536764 dated Feb. 2, 2010.
Japanese Office Action (English Translation) corresponding to Japanese Patent Application No. 2004-534428 dated Feb. 23, 2010.
Official Action corresponding to U.S. Appl. No. 11/168,018 dated Mar. 2, 2010.
Notice of Allowance corresponding to U.S. Appl. No. 11/703,721 dated Apr. 16, 2010.
Final Office Action corresponding to U.S. Appl. No. 11/153,724 dated Apr. 27, 2010.
Advisory Action corresponding to U.S. Appl. No. 11/168,018 dated May 13, 2010.
IPO (TW) Notice of Allowance corresponding to TW Patent Application No. 092123988 dated Jun. 8, 2010.
European Office Action corresponding to European Patent Application No. 09171045.9 dated Jun. 18, 2010.
Korean Patent Office Action corresponding to KR 10-2005-7003428 dated Jul. 29, 2010.
Non-Final Office Action for U.S. Appl. No. 12/856,320 dated Sep. 14, 2010.
Non-Final Office Action for U.S. Appl. No. 11/153,724 dated Sep. 15, 2010.
Official Action with Restriction/Election Requirement'corresponding to U.S. Appl. No. 10/446,532 dated Nov. 3, 2004.
Official Action with Restriction/Election Requirement corresponding to U.S. Appl. No. 10/446,532 dated Feb. 24, 2005.
Non-Final Official Action corresponding to U.S. Appl. No. 10/446,532 dated Jul. 26, 2005.
Non-Final Official Action corresponding to U.S. Appl. No. 10/446,532 dated May 2, 2006.
Official Action with Restriction/Election Requirement corresponding to U.S. Appl. No. 10/692,351 dated Oct. 5, 2004.
Non-Final Official Action corresponding to U.S. Appl. No. 10/692,351 dated Feb. 24, 2005.
Final Official Action corresponding to U.S. Appl. No. 10/692,351 dated Nov. 16, 2005.
Official Action with Advisory Action corresponding to U.S. Appl. No. 10/692,351 dated Apr. 4, 2006.
Chinese Patent Certificate for TW Patent No. 1331380 dated Oct. 1, 2010.
Japanese Notice of Issuance for JP 4602345 dated Oct. 8, 2010.
Japanese Office Action/Rejection (English Translation) corresponding to Japanese Patent Appl. No. 2004-534428 dated Oct. 19, 2010.
Chinese Notice of Patent Grant for CN Appl No. 200480030943.3 dated Oct. 29, 2010.

* cited by examiner

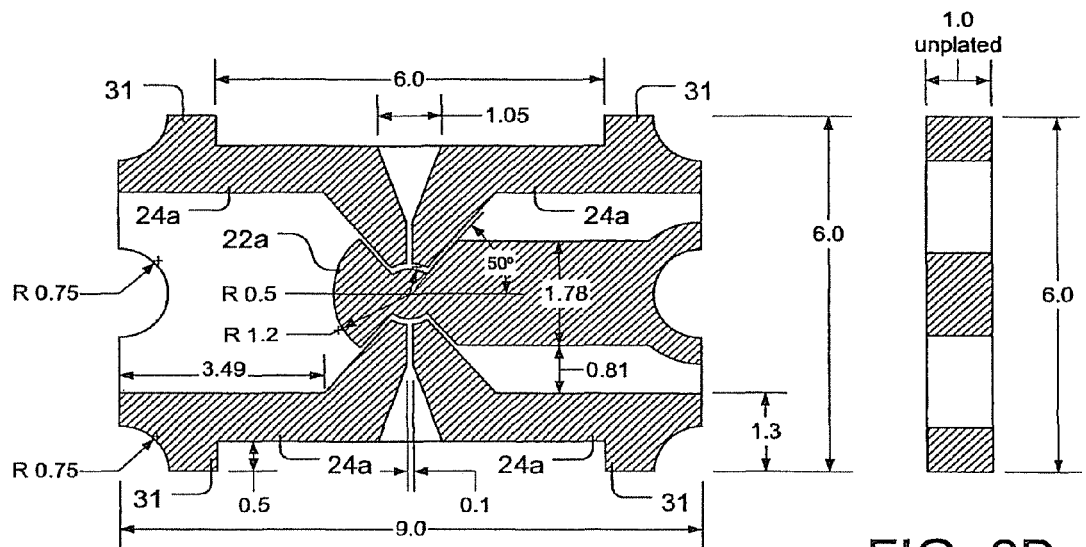
FIG. 6A
FIG. 6B
FIG. 6C
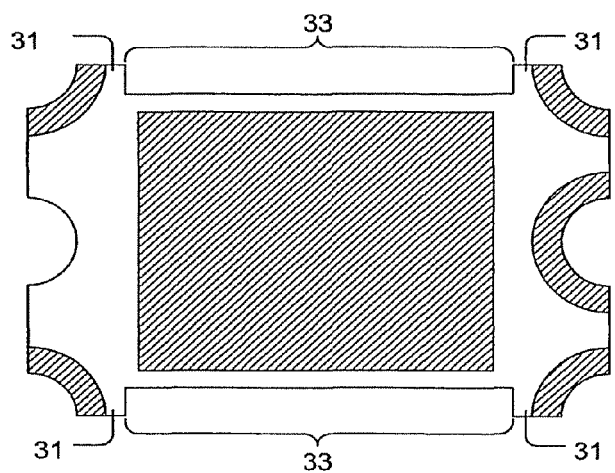
FIG. 6D

POWER SURFACE MOUNT LIGHT EMITTING DIE PACKAGE

RELATED APPLICATIONS

This application is a divisional of and claims priority benefits to U.S. patent application Ser. No. 11/703,721, filed Feb. 8, 2007 now U.S. Pat. No. 7,775,685, which is a divisional of application Ser. No. 10/446,532, filed May 27, 2003 now U.S. Pat. No. 7,264,378, the entire contents of which are both hereby incorporated by reference herein.

BACKGROUND

Example embodiments in general relate to packaging semiconductor devices which include light emitting diodes.

Light emitting diodes (LEDS) are often packaged within leadframe packages. A leadframe package typically includes a molded or cast plastic body that encapsulates an LED, a lens portion, and thin metal leads connected to the LED and extending outside the body. The metal leads of the leadframe package serve as the conduit to supply the LED with electrical power and, at the same time, may act to draw heat away from the LED. Heat is generated by the LED when power is applied to the LED to produce light. A portion of the leads extends out from the package body for connection to circuits external to the leadframe package.

Some of the heat generated by the LED is dissipated by the plastic package body; however, most of the heat is drawn away from the LED via the metal components of the package. The metal leads are typically very thin and has a small cross section. For this reason, capacity of the metal leads to remove heat from the LED is limited. This limits the amount of power that can be sent to the LED thereby limiting the amount of light that can be generated by the LED.

To increase the capacity of an LED package to dissipate heat, in one LED package design, a heat sink slug is introduced into the package. The heat sink slug draws heat from the LED chip. Hence, it increases the capacity of the LED package to dissipate heat. However, this design introduces empty spaces within the package that is be filled with an encapsulant to protect the LED chip. Furthermore, due to significant differences in CTE (coefficient of thermal expansion) between various components inside the LED package, bubbles tend to form inside the encapsulant or the encapsulant tends to delaminate from various portions within the package. This adversely affects the light output and reliability of the product. In addition, this design includes a pair of flimsy leads which are typically soldered by a hot-iron. This manufacturing process is incompatible with convenient surface mounting technology (SMT) that is popular in the art of electronic board assembly.

In another LED package design, the leads of the leadframe package have differing thicknesses extended (in various shapes and configurations) beyond the immediate edge of the LED package body. A thicker lead is utilized as a heat-spreader and the LED chip is mounted on it. This arrangement allows heat generated by the LED chip to dissipate through the thicker lead which is often connected to an external heat sink. This design is inherently unreliable due to significant difference in coefficient of thermal expansion (CTE) between the plastic body and the leadframe material. When subjected to temperature cycles, its rigid plastic body that adheres to the metal leads experiences high degree of thermal stresses in many directions. This potentially leads to various undesirable results such as cracking of the plastic body, separation of the plastic body from the LED chip, breaking of the bond wires, delaminating of the plastic body at the interfaces where it bonds to various parts, or resulting in a combination of these outcomes. In addition, the extended leads increase the package size and its footprint. For this reason, it is difficult to populate these LED packages in a dense cluster on a printed circuit board (PCB) to generate brighter light.

Another disadvantage of conventional leadframe design is that the thick lead cannot be made or stamped into a fine circuit for flip-chip mounting of a LED—which is commonly used by some manufacturers for cost-effective manufacturing and device performance.

SUMMARY

An example embodiment of the present invention is directed to a semiconductor die package including a substrate having conductive traces on a top surface thereof, and a light emitting diode (LED) mounted to the top surface of the substrate via a mounting pad. The mounting pad is electrically connected to the conductive traces on the substrate top surface. The package includes a reflector plate mechanically coupled to the substrate and substantially surrounding the mounting pad and LED, the reflector plate defining a reflection surface, and a lens substantially covering the mounting pad and LED.

Another example embodiment is directed to a semiconductor die package having a substrate, a light emitting diode (LED) mounted on the substrate via a mounting pad so that the LED is electrically connected to a top surface of the substrate, and a reflector plate coupled to the substrate and substantially surrounding the mounting pad and LED. The reflector plate has an opening there through. A lens is placed in the opening to substantially cover the mounting pad, LED and opening. The package includes an encapsulant covering the LED within at least part of the opening. The lens adheres to the encapsulant so that the lens floats on the encapsulant within the opening.

BRIEF DESCRIPTION OF THE DRAWINGS

FIG. 6A is a top view of a portion of the semiconductor package of FIG. 5;

FIG. 6B is a side view of a portion of the semiconductor package of FIG. 5;

FIG. 6C is a front view of a portion of the semiconductor package of FIG. 5; and FIG. 6D is a bottom view of a portion of the semiconductor package of FIG. 5.

DETAILED DESCRIPTION

Example embodiments will now be described with reference to the FIGS. 1 through 6D. As illustrated in the Figures, the sizes of layers or regions are exaggerated for illustrative purposes and, thus, are provided to illustrate the general structures of the present invention. Furthermore, various aspects in the example embodiments are described with reference to a layer or structure being formed on a substrate or other layer or structure. As will be appreciated by those of skill in the art, references to a layer being formed "on" another layer or substrate contemplates that additional layers may intervene. References to a layer being formed on another layer or substrate without an intervening layer are described herein as being formed "directly on" the layer or substrate.

Furthermore, relative terms such as beneath may be used herein to describe one layer or regions relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

As shown in the figures for the purposes of illustration, example embodiments of the present invention are exemplified by a light emitting die package including a bottom heat sink (substrate) having traces for connecting to a light emitting diode at a mounting pad and atop heat sink (reflector plate) substantially surrounding the mounting pad. A lens covers the mounting pad. In effect, an example die package comprises a two part heat sink with the bottom heat sink utilized (in addition to its utility for drawing and dissipating heat) as the substrate on which the LED is mounted and connected, and with the top heat sink utilized (in addition to its utility for drawing and dissipating heat) as a reflector plate to direct light produced by the LED. Because both the bottom and the top heat sinks draw heat away from the LED, more power can be delivered to the LED, and the LED can thereby produce more light.

Further, the body of the die package itself may act as the heat sink removing heat from the LED and dissipating it. For this reason, the example LED die package may not require separate heat sink slugs or leads that extend away from the package. Accordingly, the LED die package may be more compact, more reliable, and less costly to manufacture than die packages of the prior art.

Figure 1A:
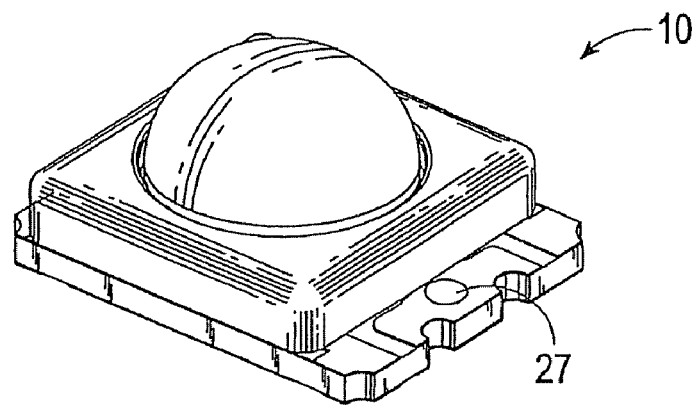
FIG. 1A is a perspective view of a semiconductor die package according to one embodiment of the present invention.
Figure 1B:
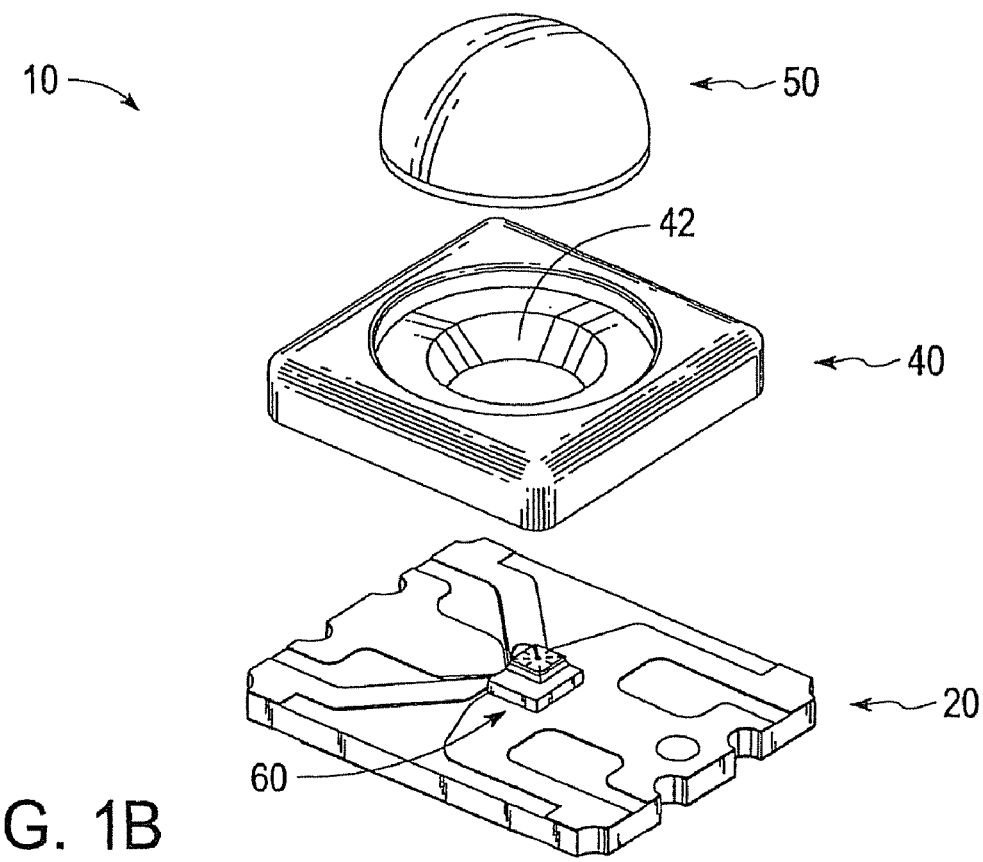
FIG. 1B is an exploded perspective view of the semiconductor package of FIG. 1A.

FIG. 1A is a perspective view of a semiconductor die package 10 according to one embodiment of the present invention and FIG. 1B is an exploded perspective view of the semiconductor package of FIG. 1A. Referring to FIGS. 1A and 1B, the light emitting die package 10 of the present invention includes a bottom heat sink 20, a top heat sink 40, and a lens 50.

The bottom heat sink 20 is illustrated in more detail in FIGS. 2A through 2D. FIGS. 2A, 2B, 2C, and 2D provide, respectively, a top view, a side view, a front view, and a bottom view of the bottom heat sink 20 of FIG. 1A. Further, FIG. 2C also shows an LED assembly 60 in addition to the front view of the bottom heat sink 20. The LED assembly 60 is also illustrated in FIG. 1B. Referring to FIGS. 1A through 2D, the bottom heat sink 20 provides support for electrical traces 22 and 24; for solder pads 26, 32, and 34; and for the LED assembly 60. For this reason, the bottom heat sink 20 is also referred to as a substrate 20. In the Figures, to avoid clutter, only representative solder pads 26, 32, and 34 are indicated with reference numbers. The traces 22 and 24 and the solder pads 32, 34, and 36 can be fabricated using conductive material. Further, additional traces and connections can be fabricated on the top, side, or bottom of the substrate 20, or layered within the substrate 20. The traces 22 and 24, the solder pads 32, 34, and 36, and any other connections can be interconnected to each other in any combination using known methods, for example via holes.

The substrate 20 is made of material having high thermal conductivity but is electrically insulating, for example, aluminum nitride (AlN) or alumina (Al.sub.2O.sub.3). Dimensions of the substrate 20 can vary widely depending on application and processes used to manufacture the die package 10. For example, in the illustrated embodiment, the substrate 20 may have dimensions ranging from fractions of millimeters (mm) to tens of millimeters. Although the present invention is not limited to particular dimensions, one specific embodiment of the die package 10 of the present invention is illustrated in Figures with the dimensions denoted therein. All dimensions shown in the Figures are in millimeters (for lengths, widths, heights, and radii) and degrees (for angles) except as otherwise designated in the Figures, in the Specification herein, or both.

The substrate 20 has a top surface 21, the top surface 21 including the electrical traces 22 and 24. The traces 22 and 24 provide electrical connections from the solder pads (for example top solder pads 26) to a mounting pad 28. The top solder pads 26 are portions of the traces 22 and 24 generally proximal to sides of the substrate 20. The top solder pads 26 are electrically connected to side solder pads 32. The mounting pad 28 is a portion of the top surface (including portions of the trace 22, the trace 24, or both) where the LED assembly 60 is mounted. Typically the mounting pad 28 is generally located proximal to center of the top surface 21. In alternative embodiments of the present invention, the LED assembly 60 can be replaced by other semiconductor circuits or chips.

The traces 22 and 24 provide electrical routes to allow the LED assembly 60 to electrically connect to the solder pads 26, 32, or 34. Accordingly, some of the traces are referred to as first traces 22 while other traces are referred to as second traces 24. In the illustrated embodiment, the mounting pad 28 includes portions of both the first traces 22 and the second traces 24. In the illustrated example, the LED assembly 60 is placed on the first trace 22 portion of the mounting pad 28 thereby making contact with the first trace 22. In the illustrated embodiment, a top of the LED assembly 60 and the second traces 24 are connected to each other via a bond wire 62. Depending on the construction and orientation of LED assembly 60, first traces 22 may provide anode (positive) connections and second traces 24 may comprise cathode (negative) connections for the LED assembly 60 (or vice versa).

The LED assembly 60 can include additional elements. For example, in FIGS. 1B and 2C, the LED assembly 60 is illustrated including an LED bond wire 62, an LED subassembly 64, and a light emitting diode (LED) 66. Such an LED subassembly 64 is known in the art and is illustrated for the purposes of discussing the invention and is not meant to be a limitation of the present invention. In the Figures, the LED assembly 60 is shown die-attached to the substrate 20. In alternative embodiments, the mounting pad 28 can be configured to allow flip-chip attachment of the LED assembly 60. Additionally, multiple LED assemblies can be mounted on the mounting pad 28. In alternative embodiments, the LED assembly 60 can be mounted over multiple traces. This is especially true if flip-chip technology is used.

Figures 2A, 2B:
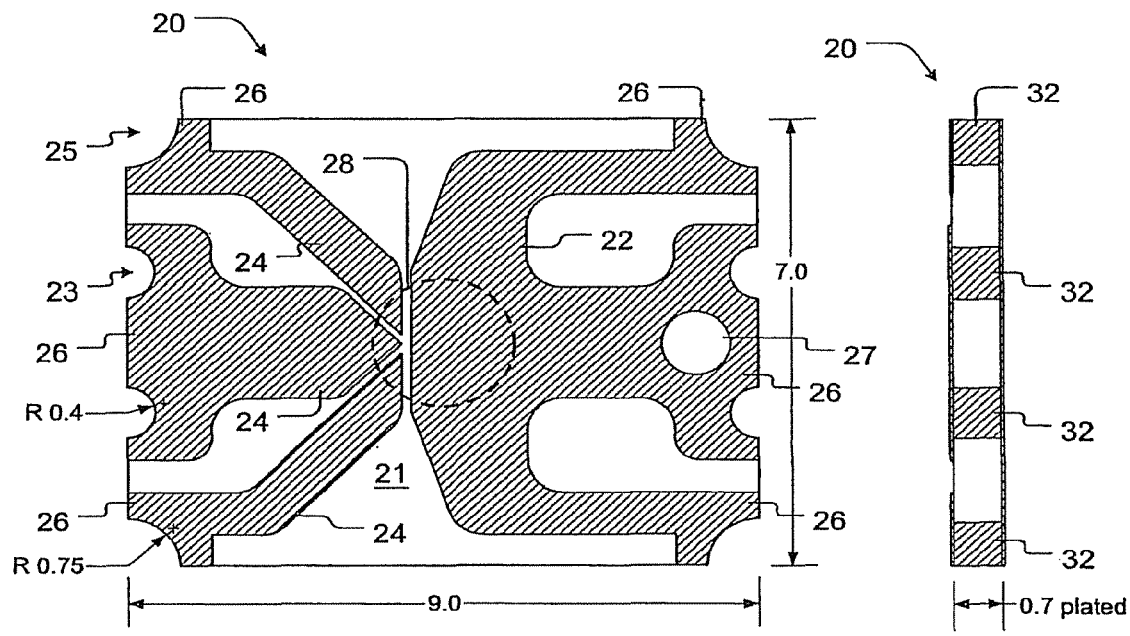
FIG. 2A is a top view of a portion of the semiconductor package of FIG. 1A.
FIG. 2B is a side view of a portion of the semiconductor package of FIG. 1A.

The topology of the traces 22 and 24 can vary widely from the topology illustrated in the Figures while still remaining within the scope of the example embodiments of the present invention. In the Figures, three separate cathode (negative) traces 24 are shown to illustrate that three LED assemblies can be placed on the mounting pad 28, each connected to a different cathode (negative) trace; thus, the three LED assemblies may be separately electrically controllable. The traces 22 and 24 are made of conductive material such as gold, silver, tin, or other metals. The traces 22 and 24 can have dimensions as illustrated in the Figures and are of a thickness on the order of microns or tens of microns, depending on application. In an example, the traces 22 and 24 can be 15 microns thick. FIGS. 1A and 2A illustrate an orientation marking 27. Such markings can be used to identify the proper orientation of the die package 10 even after assembling the die package 10. The traces 22 and 24, as illustrated, can extend from the mounting pad 28 to sides of the substrate 20.

Continuing to refer to FIGS. 1A through 2D, the substrate 20 defines semi-cylindrical spaces 23 and quarter-cylindrical spaces 25 proximal to its sides. In the Figures, to avoid clutter, only representative spaces 23 and 25 are indicated with reference numbers. The semi-cylindrical spaces 23 and the quarter-cylindrical spaces 25 provide spaces for solder to flow-through and solidify-in when the die package 10 is attached to a printed circuit board (PCB) or another apparatus (not shown) to which the die package 10 is a component thereof. Moreover, the semi-cylindrical spaces 23 and the quarter-cylindrical spaces 25 provide convenient delineation and break points during the manufacturing process.

The substrate 20 can be manufactured as one individual section of a strip or a plate having a plurality of adjacent sections, each section being a substrate 20. Alternatively, the substrate 20 can be manufactured as one individual section of an array of sections, the array having multiple rows and columns of adjacent sections. In this configuration, the semi-cylindrical spaces 23 and quarter-cylindrical spaces 25 can be utilized as tooling holes for the strip, the plate, or the array during the manufacturing process.

Furthermore, the semi-cylindrical spaces 23 and the quarter-cylindrical spaces 25, combined with scribed grooves or other etchings between the sections, assist in separating each individual substrate from the strip, the plate, or the wafer. The separation can be accomplished by introducing physical stress to the perforation (semi through holes at a close pitch) or scribe lines made by laser, or premolded, or etched lines (crossing the semi-cylindrical spaces 23 and the quarter-cylindrical spaces 25) by bending the strip, the plate, or the wafer. These features simplify the manufacturing process and thus reduce costs by eliminating the need for special carrier fixtures to handle individual unit of the substrate 20 during the manufacturing process. Furthermore, the semi-cylindrical spaces 23 and the quarter-cylindrical spaces 25 serve as via holes connecting the top solder pads 26, the side solder pads 32, and the bottom solder pads 34.

The substrate 20 has a bottom surface 29 including a thermal contact pad 36. The thermal contact pad 36 can be fabricated using a material having a high thermally and electrically conductive properties such as gold, silver, tin, or another material including but not limited to precious metals.

Figure 3:
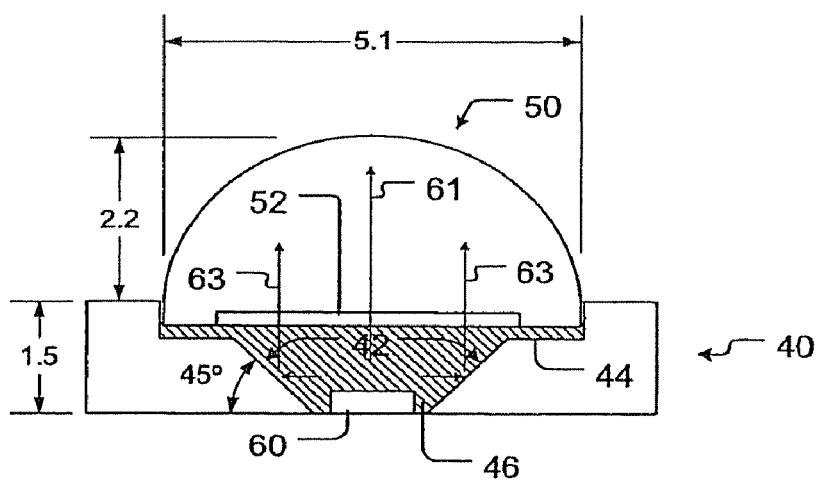
FIG. 3 is a cut-away side view of portions of the semiconductor package of FIG. 1A.

FIG. 3 illustrates a cut-away side view of portions of the semiconductor package of FIGS. 1A and 1B. In particular, the FIG. 3 illustrates a cut-away side view of the top heat sink 40 and the lens 50. Referring to FIGS. 1A, 1B, and 3, the top heat sink 40 is made from a material having high thermal conductivity such as aluminum, copper, ceramics, plastics, composites, or a combination of these materials. A high temperature, mechanically tough, dielectric material can be used to overcoat the traces 22 and 24 (with the exception of the central die-attach area) to seal the traces 22 and 24 and provide protection from physical and environmental harm such as scratches and oxidation. The overcoating process can be a part of the substrate manufacturing process. The overcoat, when used, may insulate the substrate 20 from the top heat sink 40. The overcoat may then be covered with a high temperature adhesive such as thermal interface material manufactured by THERMOSET that bonds the substrate 20 to the top heat sink 40.

Figure 2C:
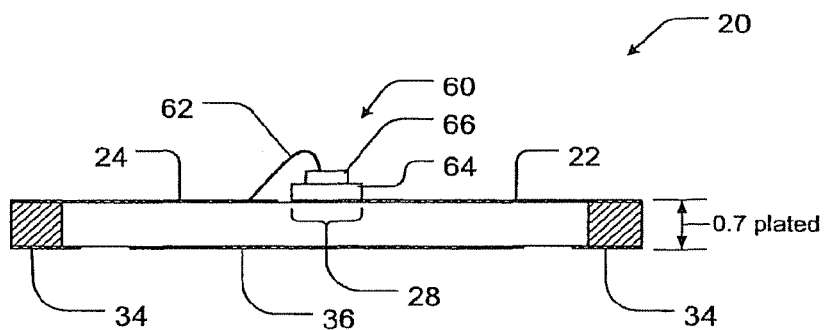
FIG. 2C is a front view of a portion of the semiconductor package of FIG. 1A.
Figure 2D:
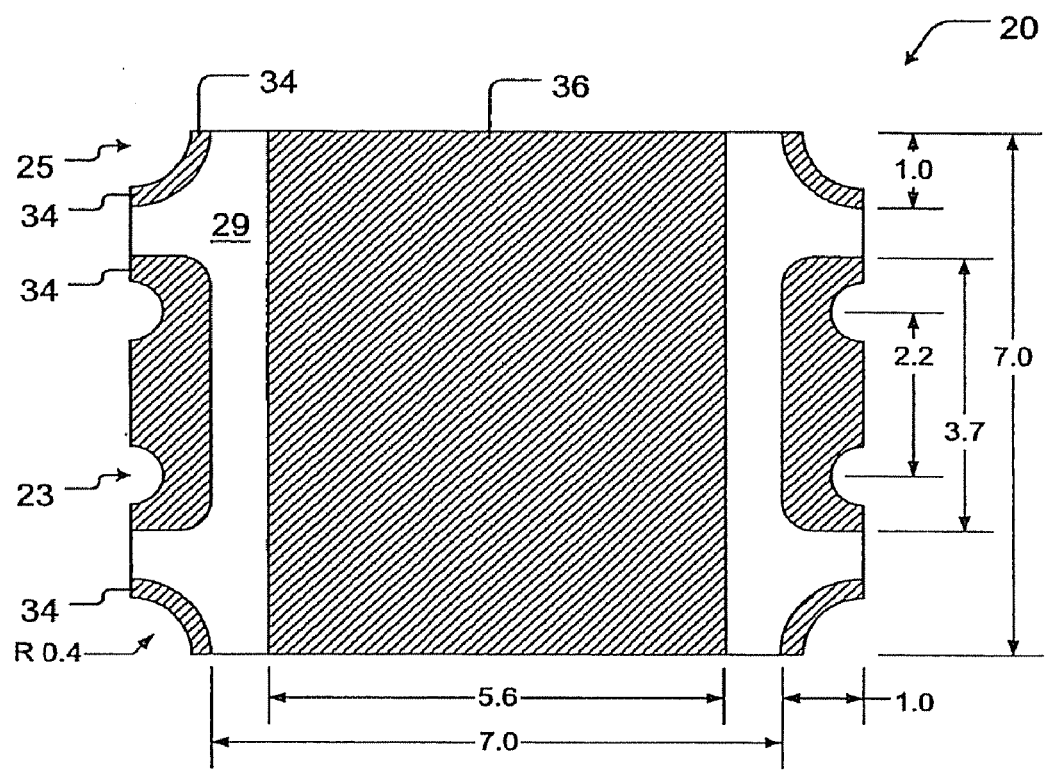
FIG. 2D is a bottom view of a portion of the semiconductor package of FIG. 1A.

The top heat sink 40 may include a reflective surface 42 substantially surrounding the LED assembly 60 mounted on the mounting pad 28 (of FIGS. 2A and 2C). When the top heat sink 40 is used to dissipate heat generated by the LED in the die package 10, it can be "top-mounted" directly onto an external heat sink by an adhesive or solder joint to dissipate heat efficiently. In another embodiment, if heat has to be dissipated by either a compressible or non-compressible medium such as air or cooling fluid, the top heat sink 40 may be equipped with cooling fins or any feature that will enhance heat transfer between the top heat sink 40 and the cooling medium. In both of these embodiments, the electrical terminals and the bottom heat sink 20 of the die package 10 can still be connected to its application printed circuit board (PCB) using, for example, the normal surface-mount-technology (SMT) method.

The reflective surface 42 reflects portions of light from the LED assembly 60 as illustrated by sample light rays 63. Other portions of the light are not reflected by the reflective surface 42 as illustrated by sample light ray 61. Illustrative light rays 61 and 63 are not meant to represent light traces often use in the optical arts. For efficient reflection of the light, the top heat sink 40 is preferably made from material that can be polished, coined, molded, or any combination of these. Alternatively, to achieve high reflectivity, the optical reflective surface 42 or the entire heat sink 40 can be plated or deposited with high reflective material such as silver, aluminum, or any substance that serves the purpose. For this reason, the top heat sink 40 is also referred to as a reflector plate 40. The reflector plate 40 is made of material having high thermal conductivity if and when required by the thermal performance of the package 10. In the illustrated embodiment, the reflective surface 42 is illustrated as a flat surface at an angle, for example 45 degrees, relative to the reflective plate's horizontal plane. The example embodiments are not limited to the illustrated embodiment. For example, the reflective surface 42 can be at a different angle relative to the reflective plate's horizontal plane. Alternatively, the reflective plate can have a parabolic, toroid or any other shape that helps to meet the desired spectral luminous performance of the package.

The reflective plate 40 includes a ledge 44 for supporting and coupling with the lens 50. The LED assembly 60 is encapsulated within the die package 10 (of FIGS. 1A and 1B) using encapsulation material 46 such as, for example only, soft and elastic silicones or polymers. The encapsulation material 46 can be a high temperature polymer with high light transmissivity and refractive index that matches or closely matches refractive index of the lens 50, for example. The encapsulant 46 is not affected by most wavelengths that alter its light transmissivity or clarity.

The lens 50 is made from material having high light transmissivity such as, for example only, glass, quartz, high temperature and transparent plastic, or a combination of these materials. The lens 50 is placed on top of and adheres to the encapsulation material 46. The lens 50 is not rigidly bonded to the reflector 40. This "floating lens" design enables the encapsulant 46 to expand and contract under high and low temperature conditions without difficulty. For instance, when the die package 10 is operating or being subjected to a high temperature environment, the encapsulant 46 experiences greater volumetric expansion than the cavity space that contains it. By allowing the lens 50 to float up somewhat freely on top of the encapsulant 46, no encapsulant will be squeezed out of its cavity space. Likewise, when the die package 10 is subjected to a cold temperature, the encapsulant 46 will contract more than the other components that make up the cavity space for the encapsulant 46; the lens will float freely on top of the encapsulant 46 as the latter shrinks and its level drops. Hence, the reliability of the die package 10 is maintained over relatively large temperature ranges as the thermal stresses induced on the encapsulant 46 is reduced by the floating lens design.

In some embodiments, the lens 50 defines a recess 52 (See FIG. 3) having a curved, hemispherical, or other geometry, which can be filled with optical materials intended to influence or change the nature of the light emitted by the LED chip(s) before it leaves the die package 10. Examples of one type of optical materials include luminescence converting phosphors, dyes, fluorescent polymers or other materials which absorb some of the light emitted by the chip(s) and re-emit light of different wavelengths. Examples of another type of optical materials include light diffusants such as calcium carbonate, scattering particles (such as Titanium oxides) or voids which disperse or scatter light. Any one or a combination of the above materials can be applied on the lens 50 to obtain certain spectral luminous performance.

Figure 4:
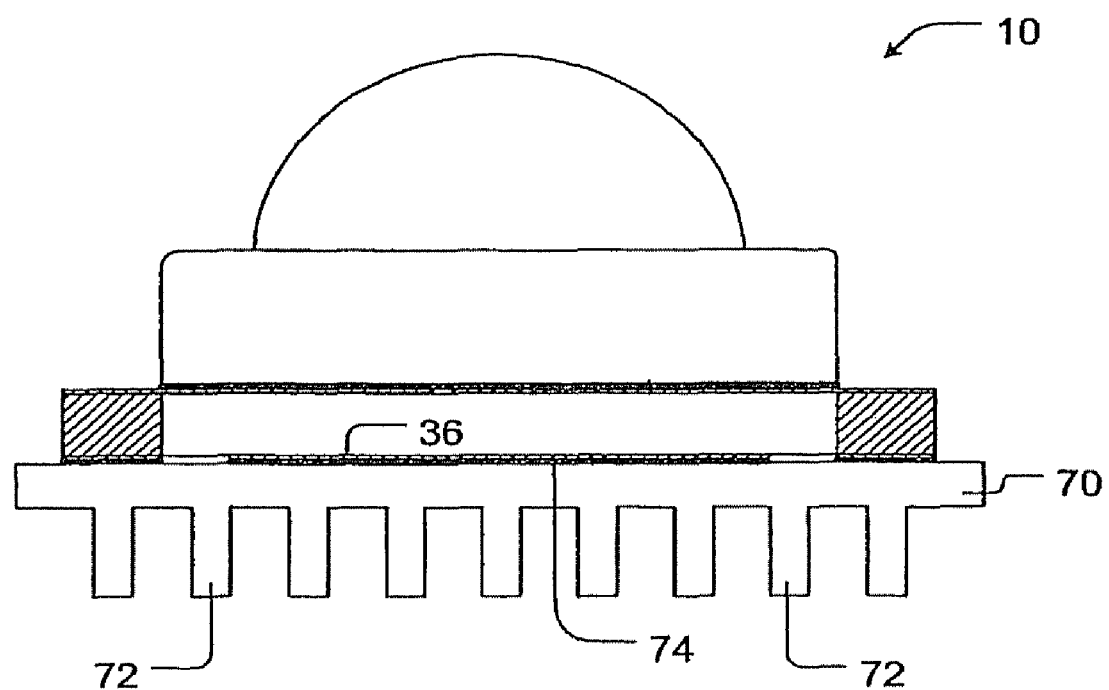
FIG. 4 is a side view of the semiconductor package of FIG. 1A with additional elements.

FIG. 4 illustrates the die package 10 coupled to an external heat sink 70. Referring to FIG. 4, the thermal contact pad 36 can be attached to the external heat sink 70 using epoxy, solder, or any other thermally conductive adhesive, electrically conductive adhesive, or thermally and electrically conductive adhesive 74. The external heat sink 70 can be a printed circuit board (PCB) or other structure that draws heat from the die package 10. The external heat sink can include circuit elements (not shown) or heat dissipation fins 72 in various configurations.

Figure 5:
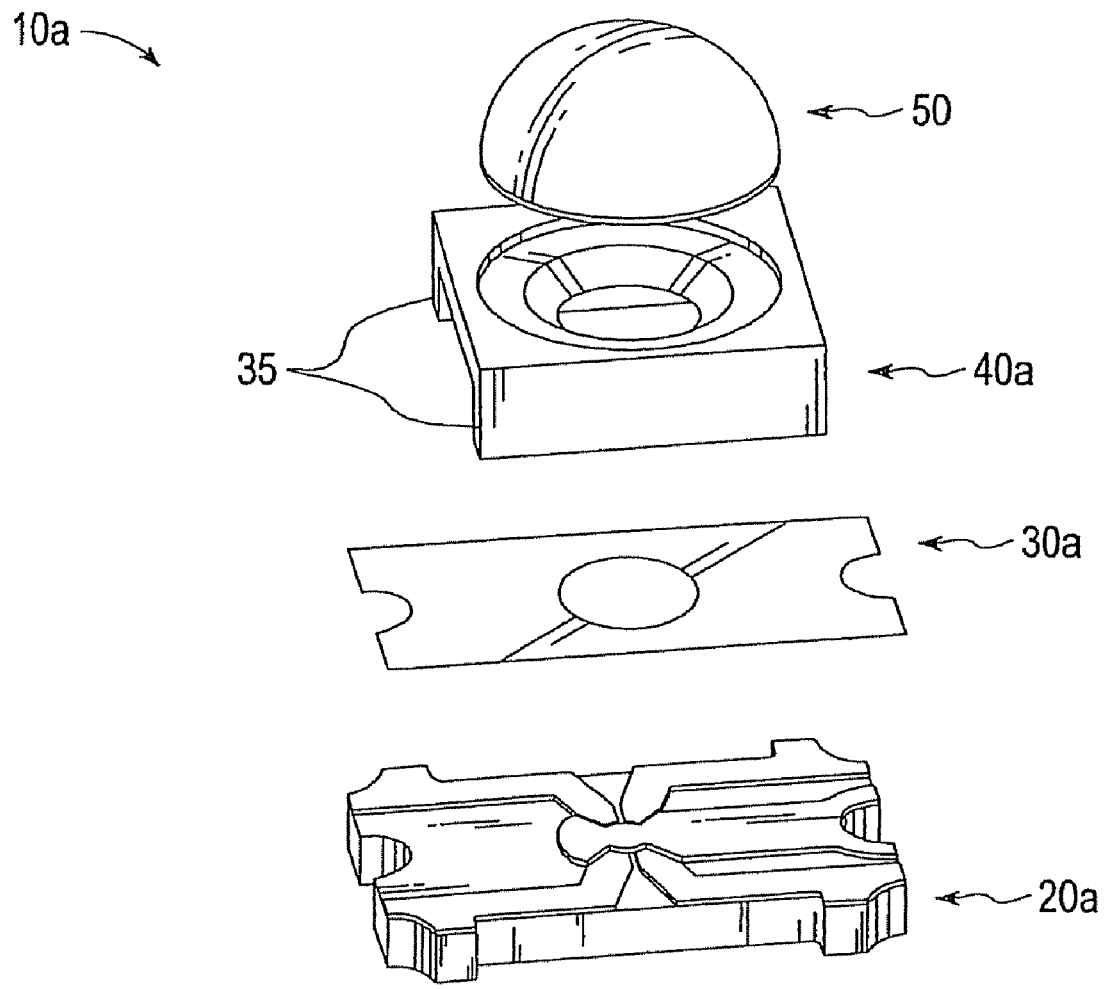
FIG. 5 an exploded perspective view of a semiconductor die package according to another embodiment of the present invention.

An example embodiment having an alternate configuration is shown in FIGS. 5 through 6D. Portions of this second embodiment are similar to corresponding portions of the first embodiment illustrated in FIGS. 1A through 4. For convenience, portions of the second embodiment as illustrated in FIGS. 5 through 6D that are similar to portions of the first embodiment are assigned the same reference numerals, analogous but changed portions are assigned the same reference numerals accompanied by letter "a," and different portions are assigned different reference numerals.

FIG. 5 is an exploded perspective view of an LED die package 10a in accordance with other embodiments of the present invention. Referring to FIG. 5, the light emitting die package 10a of the present invention includes a bottom heat sink (substrate) 20a, atop heat sink (reflector plate) 40a, and a lens 50.

FIGS. 6A, 6B, 6C, and 6D, provide, respectively, a top view, a side view, a front view, and a bottom view of the substrate 20a of FIG. 5. Referring to FIGS. 5 through 6D, the substrate 20a includes one first trace 22a and four second traces 24a. Traces 22a and 24a are configured differently than traces 22 and 24 of FIG. 2A. The substrate 20a includes flanges 31 that define latch spaces 33 for reception of legs 35 of the reflector plate 40a, thereby mechanically engaging the reflector plate 40a with the substrate 20a.

The example embodiments of the present invention being thus described, it will be obvious that the same may be varied in many ways. Such variations are not to be regarded as a departure from the exemplary embodiments of the present invention, and all such modifications as would be obvious to one skilled in the art are intended to be included within the scope of the following claims.

What is claimed is:

1. A semiconductor die package, comprising:
   a substrate,
   a light emitting diode (LED) mounted on the substrate via a mounting pad so that the LED is electrically connected to a top surface of the substrate,
   a reflector plate coupled to the substrate and substantially surrounding the mounting pad and LED, the reflector plate having an opening there through,
   a lens placed in the opening to substantially cover the mounting pad, LED and opening, and
   an encapsulant covering the LED within at least part of the opening, wherein the lens adheres to the encapsulant so that the lens floats on the encapsulant within the opening.

2. The semiconductor die package of claim 1, wherein the reflector plate further defines a reflection surface.

3. The semiconductor die package of claim 1, wherein the reflector plate and substrate serve as corresponding top and bottom heat sinks for removing heat away from the LED during package operation.

4. An apparatus comprising:
   a substrate having a top surface and a bottom surface, a portion of the top surface defining a mounting pad;
   a plurality of conductive traces on the top surface of said substrate, said conductive traces extending from the mounting pad to a side edge of said substrate and said conductive traces comprising electrically conductive material;
   a reflector attached to the top surface of said substrate, said reflector surrounding the mounting pad while leaving other portions of the top surface of said substrate and portions of the conductive traces exposed, said reflector partially defining an optical cavity;
   at least one photonic device attached to at least one conductive trace at the mounting pad; and
   a heat sink coupled to the bottom surface of said substrate.

* * * * *